United States Patent
Hsu

(10) Patent No.: US 10,002,650 B1
(45) Date of Patent: Jun. 19, 2018

(54) SIGNAL QUALITY DETECTION CIRCUIT FOR GENERATING SIGNAL QUALITY DETECTION RESULT ACCORDING TO TWO-DIMENSIONAL NOMINAL SAMPLING POINT PATTERN AND ASSOCIATED SIGNAL QUALITY DETECTION METHOD

(71) Applicant: MEDIATEK INC., Hsin-Chu (TW)

(72) Inventor: Pin-Huan Hsu, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days. days.

(21) Appl. No.: 15/387,602

(22) Filed: Dec. 21, 2016

(51) Int. Cl.
*G11C 7/06* (2006.01)
*G11C 7/22* (2006.01)
*H03K 5/24* (2006.01)
*G11C 8/18* (2006.01)
*G01R 31/317* (2006.01)

(52) U.S. Cl.
CPC .......... *G11C 7/22* (2013.01); *G01R 31/31708* (2013.01); *G11C 8/18* (2013.01); *H03K 5/24* (2013.01)

(58) Field of Classification Search
CPC ... G11C 7/22; G11C 8/18; H03K 5/24; G01R 31/31708
USPC ..................................... 365/189.07
See application file for complete search history.

(56) References Cited

U.S. PATENT DOCUMENTS

| | | | | |
|---|---|---|---|---|
| 6,111,833 | A * | 8/2000 | Nakagawa | G11B 20/10009 369/124.1 |
| 6,583,903 | B1 * | 6/2003 | Way | H04B 10/2569 398/152 |
| 6,735,259 | B1 * | 5/2004 | Roberts | H04L 7/0337 375/316 |
| 7,788,571 | B2 * | 8/2010 | Waschura | G01R 31/3171 370/333 |
| 8,111,784 | B1 * | 2/2012 | Ding | H04L 25/063 327/141 |
| 8,982,999 | B2 * | 3/2015 | Bhagavathula | H04L 7/0066 327/165 |
| 9,355,708 | B2 * | 5/2016 | Yu | G11C 11/4091 |
| 9,378,843 | B1 * | 6/2016 | Hossain | H03L 7/00 |
| 9,401,721 | B1 * | 7/2016 | Barakat | G11C 7/1084 |
| 9,410,721 | B2 * | 8/2016 | Cravens | H02K 44/00 |
| 9,449,588 | B2 * | 9/2016 | Verderosa | G10G 5/00 |
| 9,515,856 | B2 * | 12/2016 | Kaviani | H04L 25/03063 |
| 9,582,018 | B1 * | 2/2017 | Wang | G05F 1/625 |
| 9,614,538 | B1 * | 4/2017 | Hossain | G11C 27/02 |
| 2003/0142740 | A1 * | 7/2003 | Haunstein | H04L 7/033 375/233 |
| 2003/0165201 | A1 * | 9/2003 | Shahar | H03M 13/31 375/316 |

(Continued)

*Primary Examiner* — Viet Q Nguyen
(74) *Attorney, Agent, or Firm* — Winston Hsu

(57) ABSTRACT

A signal quality detection circuit has a sampling circuit and a comparing circuit. The sampling circuit samples an input signal associated with a target device according to a plurality of nominal sampling points, and generates a plurality of sampled bits corresponding to the nominal sampling points, respectively. The nominal sampling points are set by different combinations of sampling time and sampling reference voltage, and the number of the nominal sampling points is larger than four. The comparing circuit generates a signal quality detection result by performing comparison according to the sampled bits.

19 Claims, 9 Drawing Sheets

(56) References Cited

U.S. PATENT DOCUMENTS

| | | | |
|---|---|---|---|
| 2003/0174789 A1* | 9/2003 | Waschura | H04L 25/03343 375/340 |
| 2004/0120352 A1* | 6/2004 | Jungerman | H04L 1/24 370/503 |
| 2004/0183559 A1* | 9/2004 | Ware | G01R 31/31707 324/750.3 |
| 2004/0203559 A1* | 10/2004 | Stojanovic | H04L 25/063 455/403 |
| 2005/0058234 A1* | 3/2005 | Stojanovic | H04L 7/0334 375/371 |
| 2005/0134306 A1* | 6/2005 | Stojanovic | H04L 25/028 326/31 |
| 2008/0137789 A1* | 6/2008 | Cranford | H04L 7/042 375/354 |
| 2008/0181289 A1* | 7/2008 | Moll | H04L 1/242 375/224 |
| 2009/0234604 A1* | 9/2009 | Hou | G01R 31/31937 702/69 |
| 2013/0101075 A1* | 4/2013 | Helmschmidt | H04L 7/042 375/355 |

\* cited by examiner

SIGNAL QUALITY DETECTION CIRCUIT FOR GENERATING SIGNAL QUALITY DETECTION RESULT ACCORDING TO TWO-DIMENSIONAL NOMINAL SAMPLING POINT PATTERN AND ASSOCIATED SIGNAL QUALITY DETECTION METHOD

BACKGROUND

The present invention relates to a signal quality detection scheme, and more particularly, to a signal quality detection circuit for generating a signal quality detection result according to a two-dimensional nominal sampling point pattern and an associated signal quality detection method.

An oscilloscope is a type of electronic test instrument that allows observation of constantly varying signal voltages, and usually displays a two-dimensional plot of one or more signals as a function of time. Hence, the oscilloscope is commonly used to observe the change of an electrical signal (e.g., a voltage signal) over time. The observed waveform can be analyzed for determining signal properties such as amplitude, frequency, distortion and others. However, to use an oscilloscope to measure a signal quality of an electrical signal of a device under test, the associated preparatory work is quite troublesome. Moreover, the oscilloscope is required to use probes to receive signals from the device under test. However, it is possible that the probes of the oscilloscope are unable to have direct contact with the device under test, and are therefore indirectly connected to the device under test via an intermediate medium/structure. As a result, the measured signal quality may be different from the actual signal quality of the electrical signal of the device under test.

The oscilloscope is quite expensive, and may not be affordable for every manufacturer. In addition, the oscilloscope requires calibration, repair, etc. Hence, a considerable maintenance fee of the oscilloscope may be needed. Further, a lot of manpower may be needed to perform the signal quality measurement using the oscilloscope. As a result, using an oscilloscope to measure a signal quality of an electrical signal of a device under test is not a cost-efficient solution.

Thus, there is a need for an innovative signal quality detection scheme capable of detecting actual signal quality of an electrical signal of a device under test (e.g., a dynamic random access memory) without the use of an oscilloscope.

SUMMARY

One of the objectives of the claimed invention is to provide a signal quality detection circuit for generating a signal quality detection result according to a two-dimensional nominal sampling point pattern and an associated signal quality detection method.

According to a first aspect of the present invention, an exemplary signal quality detection circuit is disclosed. The exemplary signal quality detection circuit includes a sampling circuit and a comparing circuit. The sampling circuit is configured to sample an input signal associated with a target device according to a plurality of nominal sampling points, and generate a plurality of sampled bits corresponding to the nominal sampling points, respectively, wherein the nominal sampling points are set by different combinations of sampling time and sampling reference voltage, and a number of the nominal sampling points is larger than four. The comparing circuit is configured to generate a signal quality detection result by performing comparison according to the sampled bits.

According to a second aspect of the present invention, an exemplary signal quality detection method is disclosed. The exemplary signal quality detection method includes: setting a plurality of nominal sampling points by different combinations of sampling time and sampling reference voltage, wherein a number of the nominal sampling points is larger than four; sampling an input signal associated with a target device according to the nominal sampling points, and generating a plurality of sampled bits corresponding to the nominal sampling points, respectively; and generating a signal quality detection result by performing comparison according to the sampled bits.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
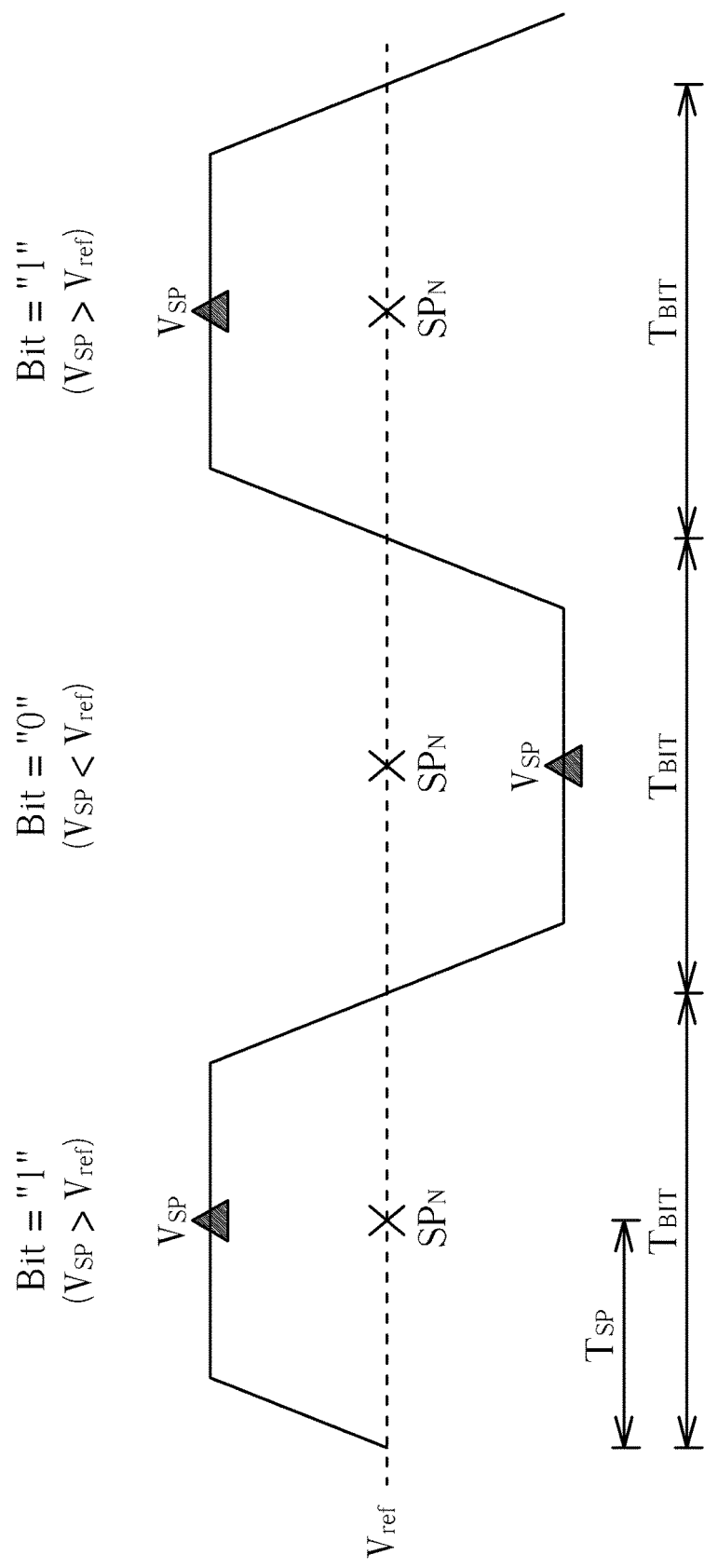
FIG. 1 is a diagram illustrating a sampling operation performed upon an input signal according to a nominal sampling point.

FIG. 1 is a diagram illustrating a sampling operation performed upon an input signal according to a nominal sampling point. As shown in FIG. 1, a nominal sampling point $SP_N$ is set by a combination of sampling time $T_{SP}$ and sampling reference voltage $V_{ref}$. In this example, an input signal $S_{IN}$ is used to transmit a bit sequence "101", where each bit is transmitted in one bit period $T_{BIT}$. During the first bit period $T_{BIT}$, a voltage $V_{SP}$ is sampled at the sampling time $T_{SP}$ of the nominal sampling point $SP_N$, and the sampled voltage $V_{SP}$ is compared with the sampling reference voltage $V_{ref}$ of the nominal sampling point $SP_N$. Since the sampled voltage $V_{SP}$ is higher than the sampling reference voltage $V_{ref}$ (i.e., $V_{SP} > V_{ref}$), a sampled bit that is represented by the sampled voltage $V_{SP}$ obtained during the first bit period $T_{BIT}$ is judged to be "1".

During the second bit period $T_{BIT}$, a voltage $V_{SP}$ is sampled at the sampling time $T_{SP}$ of the nominal sampling point $SP_N$, and the sampled voltage $V_{SP}$ is compared with the sampling reference voltage $V_{ref}$ of the nominal sampling point $SP_N$. Since the sampled voltage $V_{SP}$ is lower than the sampling reference voltage $V_{ref}$ (i.e., $V_{SP} < V_{ref}$), a sampled bit that is represented by the sampled voltage $V_{SP}$ obtained during the second bit period $T_{BIT}$ is judged to be "0".

During the third bit period $T_{BIT}$, a voltage $V_{SP}$ is sampled at the sampling time $T_{SP}$ of the nominal sampling point $SP_N$, and the sampled voltage $V_{SP}$ is compared with the sampling reference voltage $V_{ref}$ of the nominal sampling point $SP_N$. Since the voltage $V_{SP}$ is higher than the sampling reference voltage $V_{ref}$ (i.e., $V_{SP} > V_{ref}$), a sampled bit that is represented by the sampled voltage $V_{SP}$ obtained during the third bit period $T_{BIT}$ is judged to be "1".

FIG. 1 shows an ideal waveform of the input signal $S_{IN}$ that transmits the bit sequence "101" with no signal distortion. However, an actual waveform of the input signal $S_{IN}$ that transmits the bit sequence "101" may be distorted due to certain factors. As a result, using the nominal sampling point $SP_N$ shown in FIG. 1 may not correctly recover the sampled bits "1", "0", "1" from the input signal $S_{IN}$ with a distorted waveform. If the signal quality of the input signal $S_{IN}$ is known, the signal quality may provide information needed for configuring the hardware circuitry to correctly obtain sampled bits from the input signal $S_{IN}$. In contrast to a typical signal quality measurement design using an oscilloscope, the present invention proposes using a nominal sampling point pattern to achieve the signal quality detection needed.

Figure 2:
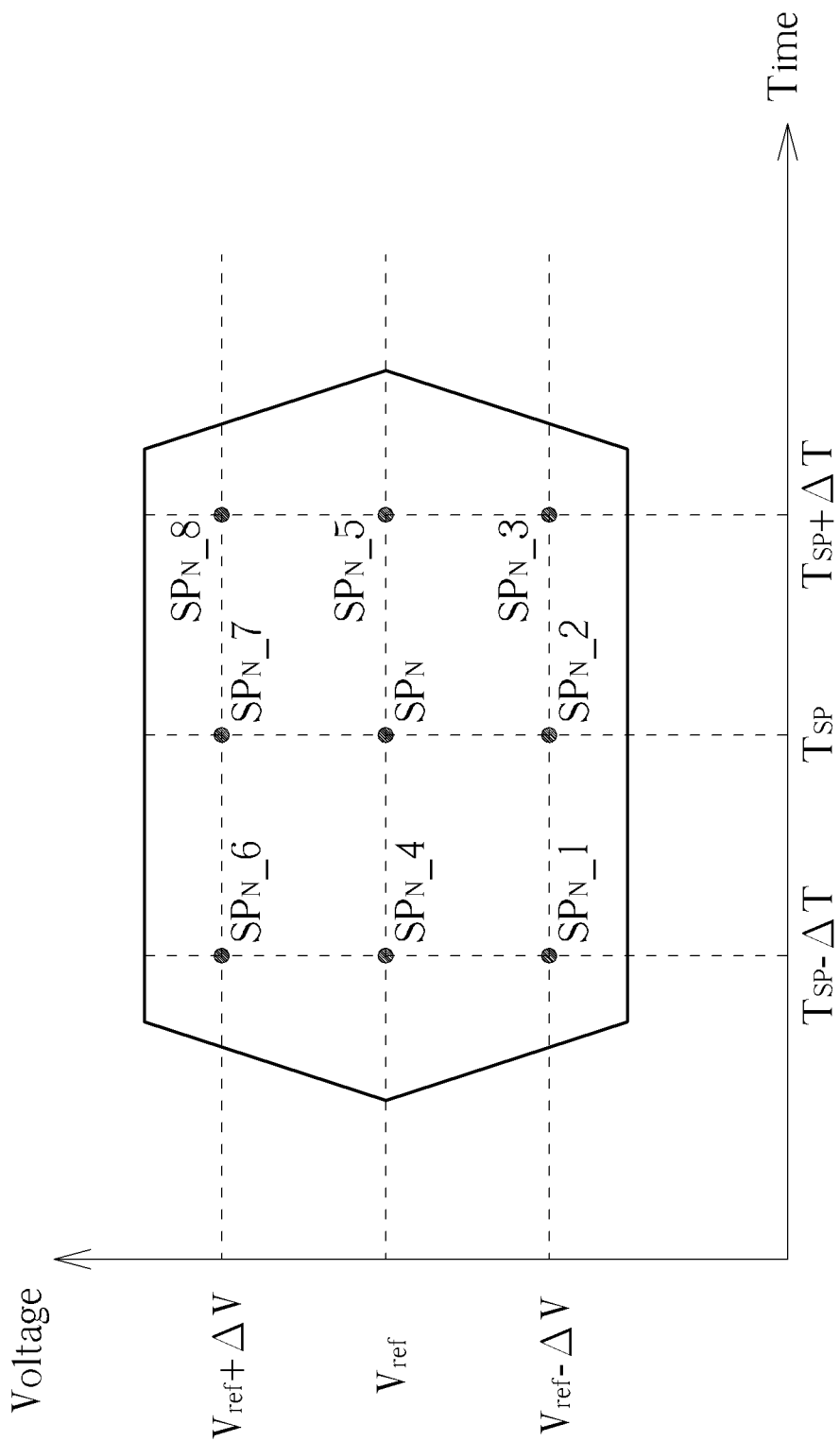
FIG. 2 is a diagram illustrating a two-dimensional nominal sampling point pattern according to an embodiment of the present invention.

FIG. 2 is a diagram illustrating a two-dimensional nominal sampling point pattern according to an embodiment of the present invention. In this example, an eye pattern of an input signal may be simply modeled by a hexagon. Hence, a nominal sampling point pattern defined by multiple nominal sampling points (e.g., nine nominal sampling points $SP_N$ and $SP_{N\_1}$-$SP_{N\_8}$) may be used for signal quality detection. By way of example, but not limitation, the nominal sampling points $SP_N$ and $SP_{N\_1}$-$SP_{N\_8}$ used for signal quality detection may be selected according to the clock frequency, the semiconductor process, etc. As shown in FIG. 2, in addition to the central nominal sampling point $SP_N$ (which is set by sampling time $T_{SP}$ and sampling reference voltage $V_{ref}$), neighboring nominal sampling points $SP_{N\_1}$-$SP_{N\_8}$ are also selected, where the nominal sampling point $SP_{N\_1}$ is set by a combination of sampling time $T_{SP}-\Delta T$ and sampling reference voltage $V_{ref}-\Delta V$, the nominal sampling point $SP_{N\_2}$ is set by a combination of sampling time $T_{SP}$ and sampling reference voltage $V_{ref}-\Delta V$, the nominal sampling point $SP_{N\_3}$ is set by a combination of sampling time $T_{SP}+\Delta T$ and sampling reference voltage $V_{ref}-\Delta V$, the nominal sampling point $SP_{N\_4}$ is set by a combination of sampling time $T_{SP}-\Delta T$ and sampling reference voltage $V_{ref}$, the nominal sampling point $SP_{N\_5}$ is set by a combination of sampling time $T_{SP}+\Delta T$ and sampling reference voltage $V_{ref}$, the nominal sampling point $SP_{N\_6}$ is set by a combination of sampling time $T_{SP}-\Delta T$ and sampling reference voltage $V_{ref}+\Delta V$, the nominal sampling point $SP_{N\_7}$ is set by a combination of sampling time $T_{SP}$ and sampling reference voltage $V_{ref}+\Delta V$, and the nominal sampling point $SP_{N\_8}$ is set by a combination of sampling time $T_{SP}+\Delta T$ and sampling reference voltage $V_{ref}+\Delta V$. In this example, the nominal sampling points $SP_N$ and $SP_{N\_1}$-$SP_{N\_8}$ are set by different combinations of sampling time and sampling reference voltage, where different sampling reference voltages $V_{ref}-\Delta V$, $V_{ref}$, $V_{ref}+\Delta V$ are equally spaced, and the different sampling time $T_{SP}-\Delta T$, $T_{SP}$, $T_{SP}+\Delta T$ is equally spaced. However, this is for illustrative purposes only, and is not meant to be a limitation of the present invention. Alternatively, different sampling reference voltages used for configuring different nominal sampling points may be set by other voltage values according to the actual design considerations, and/or different sampling time used for configuring different nominal sampling points may be set by other timing values according to the actual design considerations. To put it simply, the nominal sampling point pattern shown in FIG. 2 is for illustrative purposes only, and is not meant to be a limitation of the present invention.

The sampled bits obtained according to the nominal sampling points $SP_N$ and $SP_{N\_1}$-$SP_{N\_8}$ are used for signal quality detection. For example, when one sampled bit obtained by one nominal sampling point during a bit period of the input signal $S_{IN}$ is different from another sampled bit obtained by another nominal sampling point during the same bit period of the input signal $S_{IN}$, the input signal $S_{IN}$ may be regarded as having a distorted waveform, and the distortion position may be determined correspondingly. Based on this observation, the present invention proposes a signal quality detection circuit which performs signal quality detection upon the input signal $S_{IN}$ according to a nominal sampling point pattern such as the nominal sampling point pattern shown in FIG. 2.

The proposed signal quality detection circuit may be configured to check the signal quality detection requirement as requested by the manufacturer. For example, the setup/hold time requirement may be examined by properly setting the time difference $\Delta T$, and the voltage requirement may be examined by properly setting the voltage difference $\Delta V$. If good signal quality is indicated by the proposed signal quality detection circuit, this means the setup/hold time requirement and the voltage requirement are both met to thereby satisfy the signal quality detection requirement as requested by the manufacturer.

Figure 3:
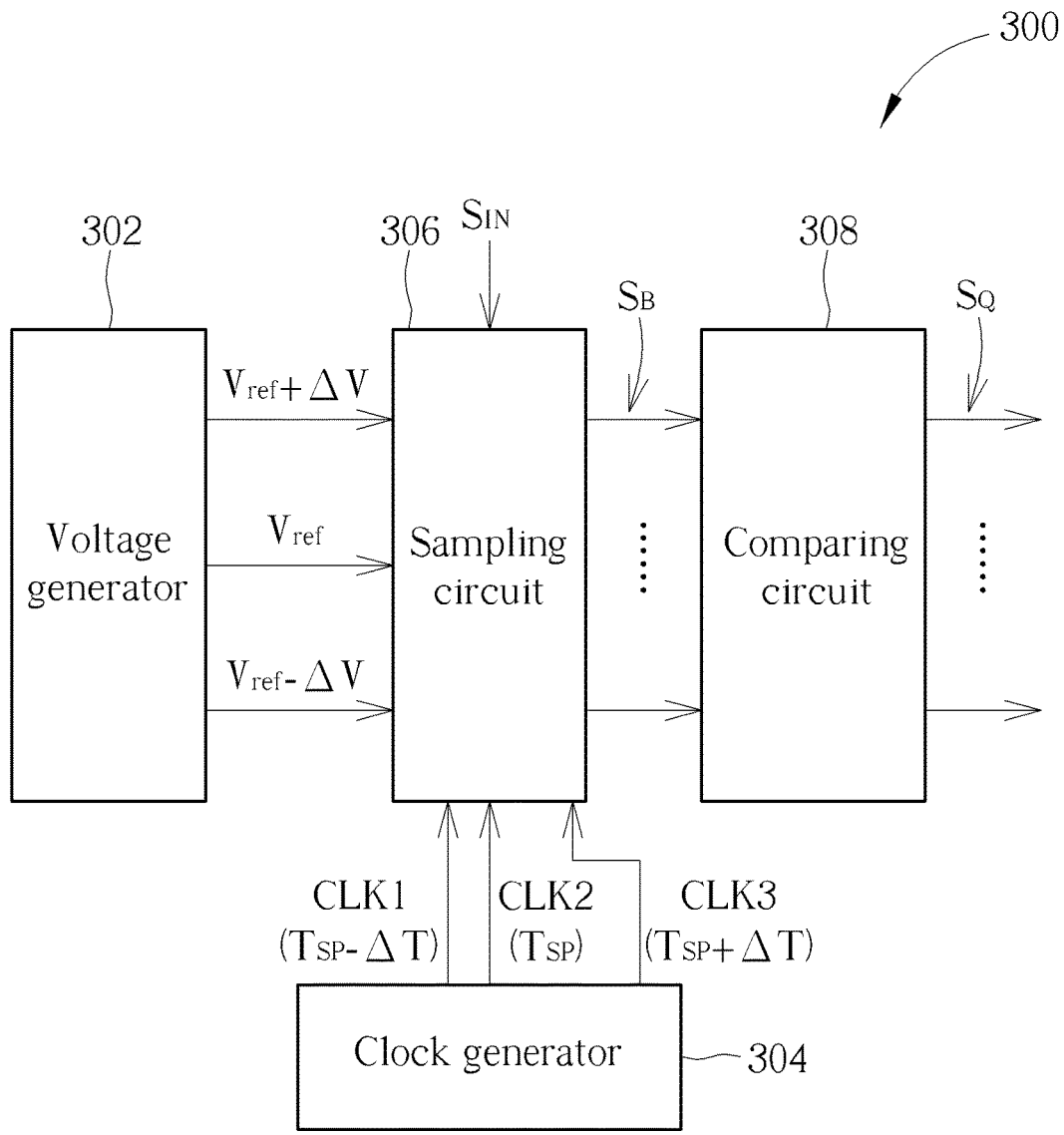
FIG. 3 is a diagram illustrating a signal quality detection circuit according to an embodiment of the present invention.

FIG. 3 is a diagram illustrating a signal quality detection circuit according to an embodiment of the present invention. The signal quality detection circuit 300 includes a voltage generator 302, a clock generator 304, a sampling circuit 306, and a comparing circuit 308. In one exemplary design, the voltage generator 302 and the clock generator 304 may be dedicated components of the signal quality detection circuit 300. In another exemplary design, the voltage generator 302 and the clock generator 304 may be common components shared by the signal quality detection circuit 300 and other signal processing circuit(s). The voltage generator 302 is configured to provide different sampling reference voltages $V_{ref}-\Delta V$, $V_{ref}$, $V_{ref}+\Delta V$. The clock generator 304 is configured to provide a plurality of clocks CLK1, CLK2, CLK3 with the same frequency but different phases. For example, when the sampling circuit 306 is rising-edge triggered, rising edges of the clocks CLK1, CLK2, CLK3 may be used to provide different sampling time $T_{SP}-\Delta T$, $T_{SP}$, $T_{SP}+\Delta T$. For another example, when the sampling circuit 306 is falling-edge triggered, falling edges of the clocks CLK1, CLK2, CLK3 may be used to provide different sampling time $T_{SP}-\Delta T$, $T_{SP}$, $T_{SP}+\Delta T$.

The sampling circuit 306 is configured to sample an input signal $S_{IN}$ associated with a target device (e.g., a memory chip) according to a plurality of nominal sampling points (e.g., $SP_N$ and $SP_N\_1$-$SP_N\_8$), and generate a plurality of sampled bits (collectively denoted by "$S_B$") corresponding to the nominal sampling points, respectively, wherein the nominal sampling points are set by different combinations of sampling time and sampling reference voltage. The number of the nominal sampling points is larger than four, depending upon the nominal sampling point pattern used. In a case where the nominal sampling point pattern shown in FIG. 2 or a larger nominal sampling point pattern is employed, the number of the nominal sampling points is not smaller than nine. The comparing circuit 308 is configured to generate a signal quality detection result $S_Q$ by performing comparison according to the sampled bits $S_B$ obtained by the sampling circuit 306.

Figure 4:
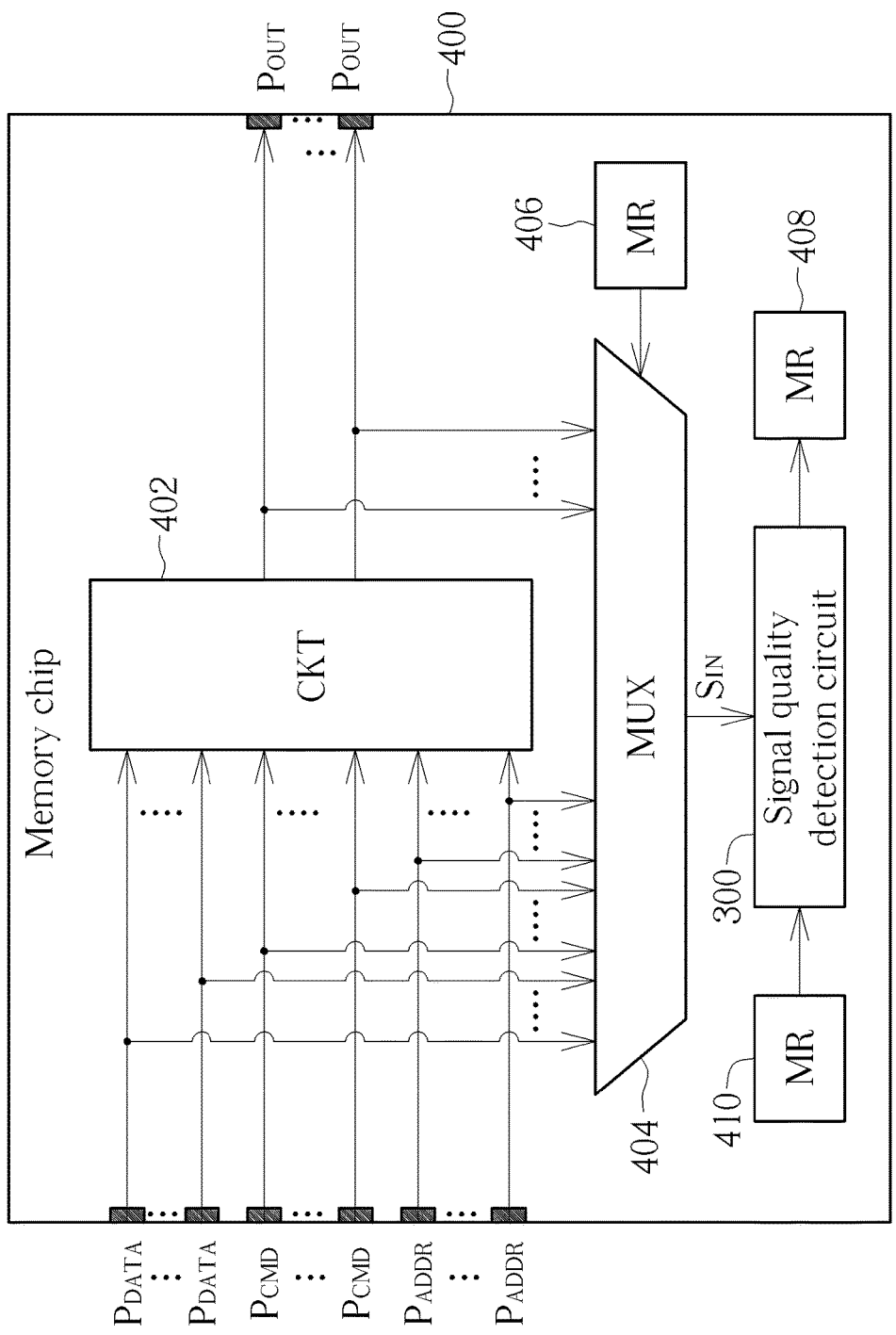
FIG. 4 is a diagram illustrating a memory chip with an internal signal quality detection circuit according to an embodiment of the present invention.

In one exemplary application, the target device with the input signal $S_{IN}$ that is examined by the signal quality detection circuit 300 may be a memory chip such as a low-power double-data-rate memory (LPDDR4) chip. The signal quality detection circuit 300 may be integrated within the memory chip to provide an on-chip signal quality detection function. FIG. 4 is a diagram illustrating a memory chip with an internal signal quality detection circuit according to an embodiment of the present invention. By way of example, but not limitation, the memory chip 400 may be an LPDDR4 chip. As shown in FIG. 4, the memory chip 400 includes memory circuitry 402 (denoted by "CKT") that may include memory cells, a read circuit, a write circuit, a self-refresh circuit, etc. Hence, the memory circuitry CKT receives a plurality of data signals from a plurality of data pins $P_{DATA}$ of the memory chip 400, receives a plurality of command signals from a plurality of command pins $P_{CMD}$ of the memory chip 400, receives a plurality of address signals from a plurality of address pins $P_{ADDR}$ of the memory chip 400, and generates a plurality of output signals (e.g., memory readout signals) to a plurality of output pins $P_{OUT}$ of the memory chip 400. The data signals, command signals and address signals may be transmitted from a memory controller (not shown) to the memory chip 400, and the output signals may be transmitted from the memory chip 400 to the memory controller (not shown).

The input signal $S_{IN}$ to be examined by the signal quality detection circuit 300 may be received by one of the data pins $P_{DATA}$ of the memory chip 400, may be received by one of the command pins $P_{CMD}$ of the memory chip 400, may be received by one of the address pins $P_{ADDR}$ of the memory chip 400, or may be a loopback signal of an output signal generated to one of the output pins $P_{our}$ of the memory chip 400. In other words, the signal quality detection circuit 300 can be used to judge the signal quality of the input signal $S_{IN}$ exactly received by the memory chip 400, and can be used to judge the signal quality of the input signal $S_{IN}$ exactly transmitted from the memory chip 400. Hence, signal quality of the input signal $S_{IN}$ actually received by or transmitted from the memory chip 400 can be reflected in the signal quality detection result $S_Q$ generated from the signal quality detection circuit 300. In addition, based on the detected signal quality of the input signal $S_{IN}$, the memory chip 400 can be properly configured to set/adjust the nominal sampling point $SP_N$ that is used to recover bits transmitted via the input signal $S_{IN}$.

With regard to the memory chip 400, there is a multiplexer (MUX) 404 having a plurality of input ports coupled to data pins $P_{DATA}$, command pins $P_{CMD}$, and address pins $P_{ADDR}$ that are associated with a receiver (RX) end of the memory circuitry 402) and output pins $P_{OUT}$ that are associated with a transmitter (TX) end of the memory circuitry 402. An output port of the multiplexer 404 is coupled to the signal quality detection circuit 300. Hence, with proper signal selection control of the multiplexer 404, the same signal quality detection circuit 300 can be used to perform signal quality detection upon one of input signals received by the memory chip 400 and output signals transmitted from the memory chip 400, and then can be reused to perform signal quality detection upon another of input signals received by the memory chip 400 and output signals transmitted from the memory chip 400. The signal selection control of the multiplexer 404 may be achieved by programming a mode register (MR) 406 of the memory chip 400. That is, a source of the input signal $S_{IN}$ can be switched by adjusting one or more bits stored in the mode register 406. Further, the signal quality detection result $S_Q$ generated from the signal quality detection circuit 300 may be written into a mode register (MR) 408 of the memory chip 400, and the configuration of the signal quality detection circuit 300 may be adjusted by setting bits in a mode register (MR) 410 of the memory chip 400. It should be noted that the mode registers 406, 408, 410 may be realized using a same mode register or different mode registers, depending upon the actual design considerations. Further details of the signal quality detection circuit 300 are described as below.

Figure 5:
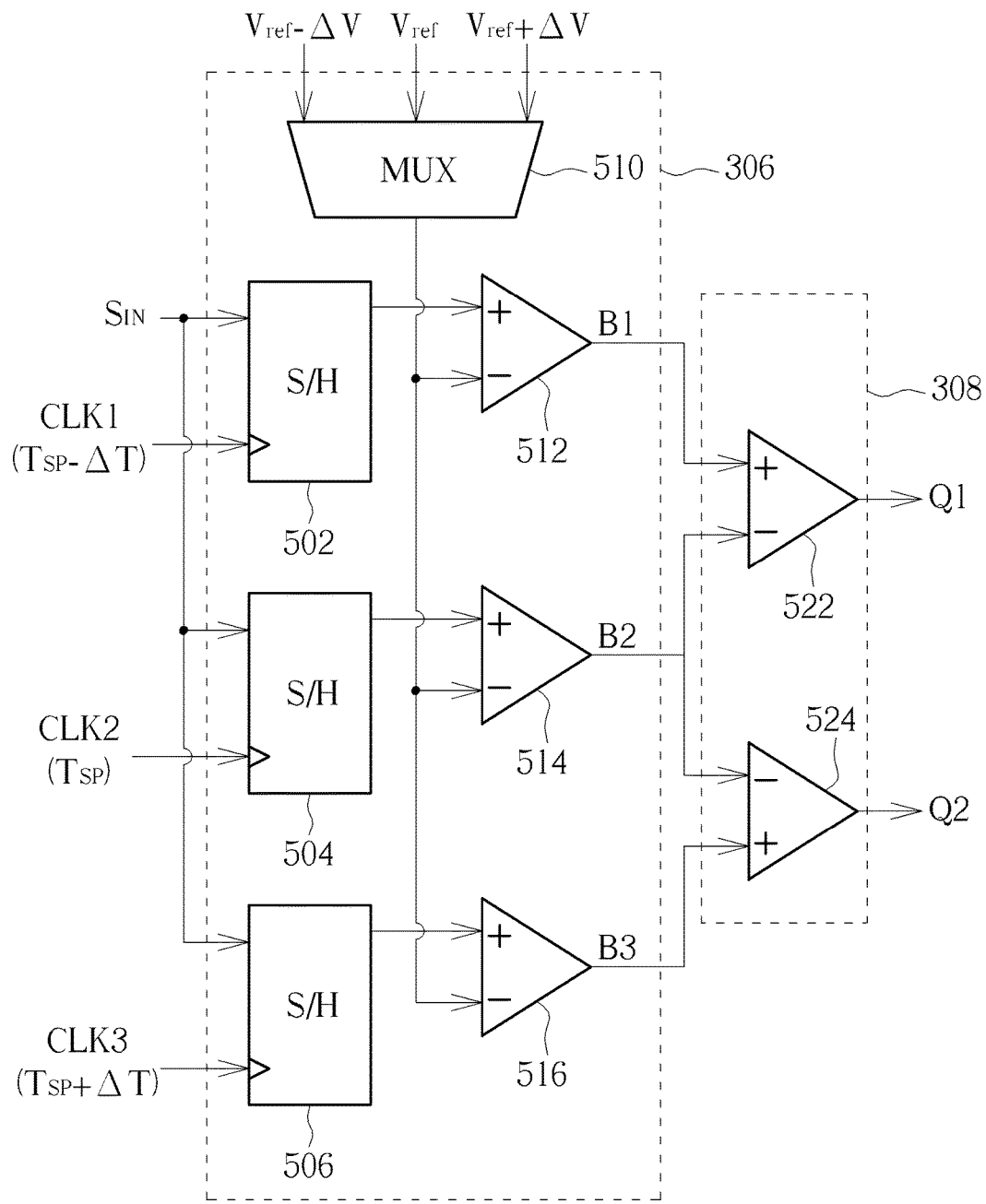
FIG. 5 is a diagram illustrating a circuit design of the sampling circuit and the comparing circuit shown in FIG. 3 according to an embodiment of the present invention.

FIG. 5 is a diagram illustrating a circuit design of the sampling circuit 306 and the comparing circuit 308 shown in FIG. 3 according to an embodiment of the present invention. To reduce hardware complexity and production cost, the sampled bits corresponding to the nominal sampling points $SP_N$ and $SP_N\_1$-$SP_N\_8$ may be obtained in three bit periods of the input signal $S_{IN}$. In this embodiment, the sampling circuit 306 includes a plurality of sample and hold circuits (denoted by "S/H") 502, 504, 506, a multiplexer (MUX) 510, and a plurality of comparators 512, 514, 516; and the comparing circuit 308 includes a plurality of comparators 522, 524. Each of the sample and hold circuits 502, 504, 506 is triggered by a clock received at a clock input port to sample a voltage input received at an input port, and then holds a sampled voltage at an output port. As shown in FIG. 5, the same input signal $S_{IN}$ is fed into input ports of all sample and hold circuits 502, 504, 506. As mentioned above, the clocks CLK1, CLK2, CLK3 have the same frequency but different phases, such that the clocks CLK1, CLK2, CLK3 are used to provide different sampling time $T_{SP}-\Delta T$, $T_{SP}$, $T_{SP}+\Delta T$. As shown in FIG. 5, the clock CLK1 is fed into the clock input port of the sample and hold circuit 502, the clock CLK2 is fed into the clock input port of the sample and hold circuit 504, and the clock CLK3 is fed into the clock input port of the sample and hold circuit 506. Hence, the waveform of the input signal $S_{IN}$ may be sampled by the sample and hold circuits 502, 504, 506 at different sampling time $T_{SP}-\Delta T$, $T_{SP}$, $T_{SP}+\Delta T$ during the same bit period. The sampled voltages are held at the output ports of the sample and hold circuits 502, 504, 506, and are provided to the comparators 512, 514, 516, respectively.

The comparators 512, 514, 516 receive the same sampling reference voltage from an output port of the multiplexer 510. The comparator 512 is configured to compare a sampled voltage generated from the preceding sample and hold circuit 502 with the received sampling reference voltage to generate a sampled bit B1. The comparator 512 is configured to compare the sampled voltage generated from the preceding sample and hold circuit 502 with the received sampling reference voltage to generate a sampled bit B2. The comparator 514 is configured to compare the sampled voltage generated from the preceding sample and hold circuit 506 with the received sampling reference voltage to generate a sampled bit B3. Concerning each of the comparators 512, 514, 516 in this embodiment, a comparison result (i.e., sampled bit) is set by a logic-high level "1" when the sampled voltage is higher than the sampling reference voltage, and the comparison result (i.e., sampled bit) is set by a logic-low level "0" when the sampled voltage is not higher than the sampling reference voltage.

During one bit period, three sampled bits B1, B2, B3 are obtained according to three nominal sampling points. Since the sampled bits B1, B2, B3 are obtained during the same bit period of the input signal $S_{IN}$, the sampled bits B1, B2, B3 are expected to have the same value if the input signal $S_{IN}$ is not distorted during the bit period. Hence, the three sampled bits B1, B2, B3 are generated from the sampling circuit 306 to the comparing circuit 308 for signal quality evaluation. The sampled bits B1, B2, B3 are obtained according to three nominal sampling points, including a middle nominal sampling point and two neighboring nominal sampling points. In this embodiment, the comparing circuit 308 generates a partial signal quality detection result associated with the three nominal sampling points by comparing the sampled bit B2 obtained according to the middle nominal sampling point with each of the sampled bits B1 and B3 obtained according to the neighboring nominal sampling points. The comparator 522 is configured to compare the sampled bits B1 and B2 to generate one bit Q1 indicative of the signal quality associated with two nominal sampling points. The comparator 524 is configured to compare the sampled bits B3 and B2 to generate one bit Q2 indicative of the signal quality associated with two nominal sampling points.

Concerning the comparator 522, a comparison result (i.e., bit Q1) is set by "0" to indicate "good" signal quality when the sampled bits B1 and B2 are the same, and the comparison result (i.e., bit Q1) is set by "1" to indicate "poor" signal quality when the sampled bits B1 and B2 are different. Concerning the comparator 524, a comparison result (i.e., bit Q2) is set by "0" to indicate "good" signal quality when the sampled bits B3 and B2 are the same, and the comparison result (i.e., Q1) is set by "1" to indicate "poor" signal quality when the sampled bits B3 and B2 are different. However, this is for illustrative purposes only, and is not meant to be a limitation of the present invention. Alternatively, the comparing circuit 308 may be modified to output "1" for indicating "good" signal quality and output "0" for indicating "poor" signal quality.

In this embodiment, the sampled bits associated with the nominal sampling points $SP_N$ and $SP_{N\_1}$-$SP_{N\_8}$ are obtained by the sampling circuit 306 in more than one bit period of the input signal $S_{IN}$ (e.g., three bit periods of the input signal $S_{IN}$). Hence, the multiplexer 510 is configured to output the sampling reference voltages $V_{ref}-\Delta V$, $V_{ref}$, $V_{ref}+\Delta V$ one by one. For example, the sampling reference voltage $V_{ref}-\Delta V$ is supplied to the comparators 512, 514, 516 during a first bit period, the sampling reference voltage $V_{ref}$ is supplied to the comparators 512, 514, 516 during a second bit period following the first bit period, and the sampling reference voltage $V_{ref}+\Delta V$ is supplied to the comparators 512, 514, 516 during a third bit period following the first bit period.

Figure 6:
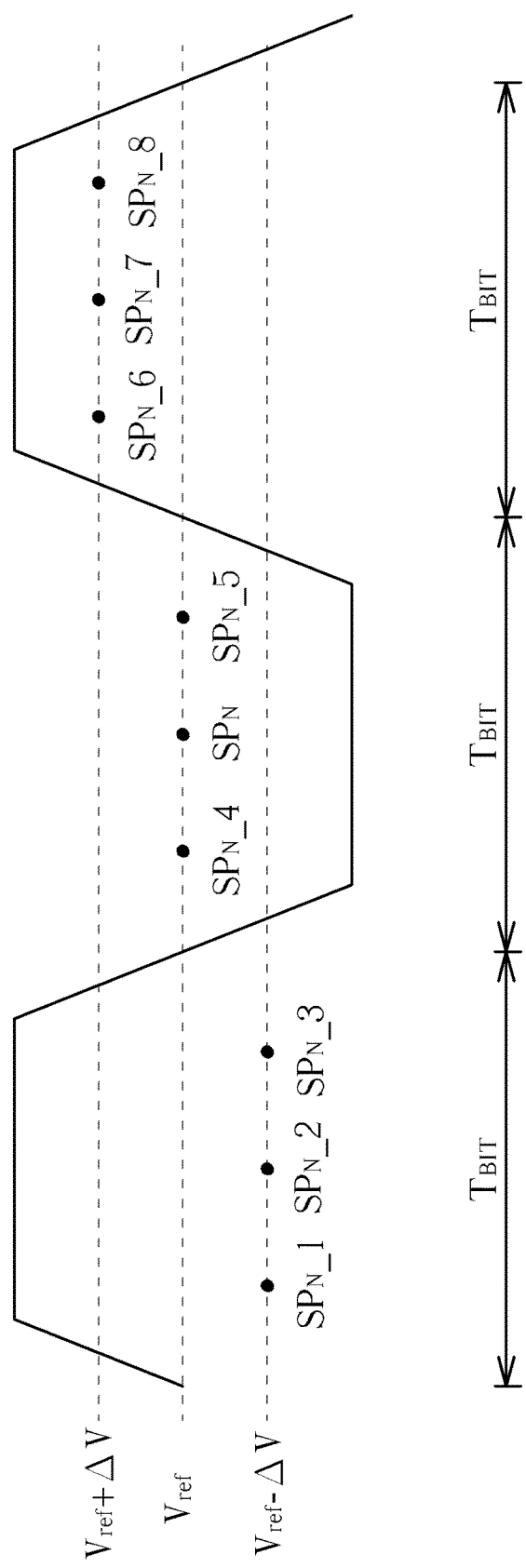
FIG. 6 is a diagram illustrating a case where the signal quality detection result generated by the proposed signal quality detection indicates "good" signal quality of an ideal input signal with no distortion.

FIG. 6 is a diagram illustrating a case where the signal quality detection result generated by the proposed signal quality detection indicates "good" signal quality of an ideal input signal with no distortion. During the first bit period $T_{BIT}$, the sampled bits corresponding to the nominal sampling points $SP_{N\_1}$, $SP_{N\_2}$, $SP_{N\_3}$ are all 1's due to the fact that the associated sampled voltages are all higher than the sampling reference voltage $V_{ref}-\Delta V$. Suppose that "good" signal quality is indicated by "0" and "poor" signal quality is indicated by "1". Hence, bits Q1 and Q2 generated from the comparing circuit 308 in FIG. 5 are set by 0's correspondingly. During the second bit period $T_{BIT}$, the sampled bits corresponding to the nominal sampling points $SP_{N\_4}$, $SP_N$, $SP_{N\_5}$ are all 0's due to the fact that the associated sampled voltages are all lower than the sampling reference voltage $V_{ref}$. Hence, bits Q1 and Q2 generated from the comparing circuit 308 in FIG. 5 are set by 0's correspondingly. During the third bit period $T_{BIT}$, the sampled bits corresponding to the nominal sampling points $SP_{N\_6}$, $SP_{N\_7}$, $SP_{N\_8}$ are all 1's due to the fact that the associated sampled voltages are all higher than the sampling reference voltage $V_{ref}+\Delta V$. Hence, bits Q1 and Q2 generated from the comparing circuit 308 in FIG. 5 are set by 0's correspondingly. Since the signal quality detection result $S_Q$ generated from the signal quality detection circuit 300 is composed of 0's only, the signal quality detection result $S_Q$ indicates that the input signal has good signal quality. In a case where the input signal $S_{IN}$ is a data signal, a command signal or an address signal actually received by the memory chip 400, the central nominal sampling point $SP_N$ of the nominal sampling point pattern employed for signal quality detection may be directly used to recover bits transmitted in following bit periods of the input signal $S_{IN}$.

Figure 7:
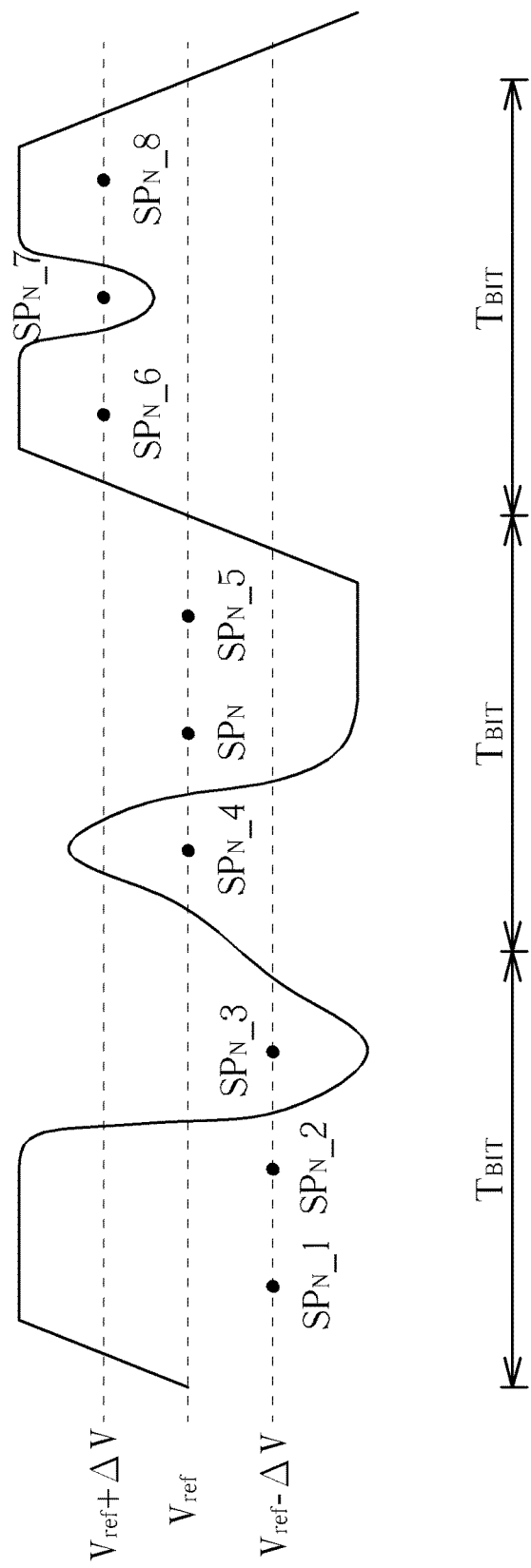
FIG. 7 is a diagram illustrating a case where the signal quality detection result generated by the proposed signal quality detection indicates "poor" signal quality of a distorted input signal with distortion.

FIG. 7 is a diagram illustrating a case where the signal quality detection result generated by the proposed signal quality detection indicates "poor" signal quality of a distorted input signal with distortion. During the first bit period $T_{BIT}$, the sampled bits corresponding to the nominal sampling points $SP_{N\_1}$, $SP_{N\_2}$ are 1's due to the fact that the associated sampled voltages are all higher than the sampling reference voltage $V_{ref}-\Delta V$, and the sampled bit corresponding to the nominal sampling point $SP_{N\_3}$ is 0 due to the fact that the associated sampled voltage is lower than the sampling reference voltage $V_{ref}-\Delta V$. Assume that "good" signal quality is indicated by "0", and "poor" signal quality is indicated by "1". Hence, bits Q1 and Q2 generated from the comparing circuit 308 in FIG. 5 are set by 0 and 1, respectively. During the second bit period $T_{BIT}$, the sampled bit corresponding to the nominal sampling point $SP_{N\_4}$ is 1 due to the fact that the associated sampled voltage is higher than the sampling reference voltage $V_{ref}$, and the sampled bits corresponding to the nominal sampling points $SP_N$, $SP_{N\_5}$ are 0's due to the fact that the associated sampled voltages are lower than the sampling reference voltage $V_{ref}$. Hence, bits Q1 and Q2 generated from the comparing circuit 308 in FIG. 5 are set by 1 and 0, respectively. During the third bit period $T_{BIT}$, the sampled bits corresponding to the nominal sampling points $SP_{N\_6}$, $SP_{N\_8}$ are 1's due to the fact that the associated sampled voltages are higher than the sampling reference voltage $V_{ref}+\Delta V$, and the sampled bit corresponding to the nominal sampling point $SP_{N\_7}$ is 0 due to the fact that the associated sampled voltage is lower than the sampling reference voltage $V_{ref}+\Delta V$. Hence, bits Q1 and Q2 generated from the comparing circuit 308 in FIG. 5 are set by 1's. Since the signal quality detection result $S_Q$ generated from the signal quality detection circuit 300 is composed of 0's and 1's, the signal quality detection result $S_Q$ indicates that the input signal has poor signal quality, where each bit "1" included in the signal quality detection result $S_Q$ also indicates the location of the signal error (e.g., signal distortion). When the signal quality detection circuit 300 is implemented in the memory chip 400, a memory controller (not shown) may refer to the signal quality detection result $S_Q$ (which indicates "poor" signal quality) to properly adjust memory access settings, such as a timing setting, a voltage setting, a frequency setting, a driving current setting, etc. Further, considering a case where the input signal $S_{IN}$ is a data signal, a command signal or an address signal actually received by the memory chip 400, the central nominal sampling point $SP_N$ of the nominal sampling point pattern employed for signal quality detection may be properly adjusted and then used to recover bits in following bit periods of the input signal $S_{IN}$.

Figure 8:
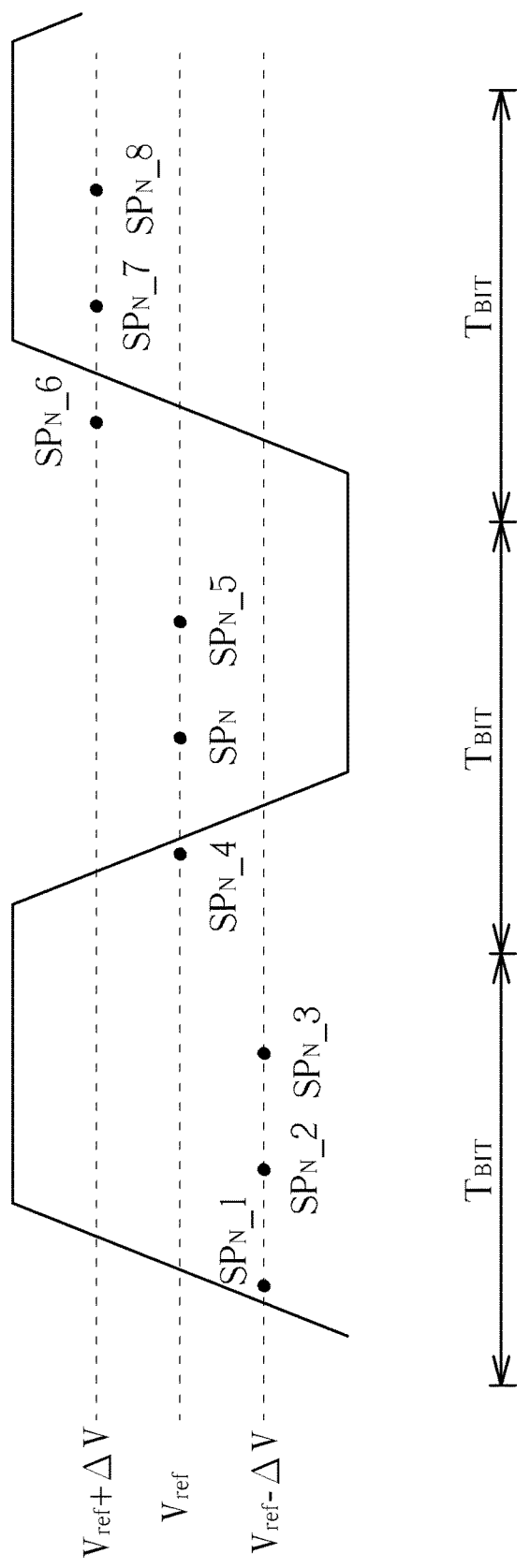
FIG. 8 is a diagram illustrating a case where the signal quality detection result generated by the proposed signal quality detection indicates "poor" signal quality of an input signal with timing shift.

FIG. 8 is a diagram illustrating a case where the signal quality detection result generated by the proposed signal quality detection indicates "poor" signal quality of an input signal with timing shift. In this example, the waveform of the input signal $S_{IN}$ shown in FIG. 8 is same as that of the input signal $S_{IN}$ shown in FIG. 6. However, the timing of the input signal $S_{IN}$ shown in FIG. 8 is shifted due to certain factor (s). During the first bit period $T_{BIT}$, the sampled bits corresponding to the nominal sampling points $SP_{N\_}1$, $SP_{N\_}2$, $SP_{N\_}3$ are 1's due to the fact that the associated sampled voltages are all higher than the sampling reference voltage $V_{ref}-\Delta V$. Assume that "good" signal quality is indicated by "0", and "poor" signal quality is indicated by "1". Hence, bits Q1 and Q2 generated from the comparing circuit 308 in FIG. 5 are set by 0's correspondingly. During the second bit period $T_{BIT}$, the sampled bit corresponding to the nominal sampling point $SP_{N\_}4$ is 1 due to the fact that the associated sampled voltage is higher than the sampling reference voltage $V_{ref}$, and the sampled bits corresponding to the nominal sampling points $SP_N$, $SP_{N\_}5$ are 0's due to the fact that the associated sampled voltages are lower than the sampling reference voltage $V_{ref}$. Hence, bits Q1 and Q2 generated from the comparing circuit 308 in FIG. 5 are set by 1 and 0, respectively. During the third bit period $T_{BIT}$, the sampled bits corresponding to the nominal sampling points $SP_{N\_}7$, $SP_{N\_}8$ are 1's due to the fact that the associated sampled voltages are higher than the sampling reference voltage $V_{ref}+\Delta V$, and the sampled bit corresponding to the nominal sampling point $SP_{N\_}6$ is 0 due to the fact that the associated sampled voltage is lower than the sampling reference voltage $V_{ref}+\Delta V$. Hence, bits Q1 and Q2 generated from the comparing circuit 308 in FIG. 5 are set by 1 and 0, respectively. Since the signal quality detection result $S_Q$ generated from the signal quality detection circuit 300 is composed of 0's and 1's, the signal quality detection result $S_Q$ indicates that the input signal has poor signal quality, where each bit "1" included in the signal quality detection result $S_Q$ also indicates the location of the signal error (e.g., signal timing shift). When the signal quality detection circuit 300 is implemented in the memory chip 400, a memory controller (not shown) may refer to the signal quality detection result $S_Q$ (which indicates "poor" signal quality) to properly adjust memory access settings, such as a timing setting, a voltage setting, a frequency setting, a driving current setting, etc. Further, considering a case where the input signal $S_{IN}$ is a data signal, a command signal or an address signal actually received by the memory chip 400, the central nominal sampling point $SP_N$ of the nominal sampling point pattern employed for signal quality detection may be properly adjusted and then used to recover bits in following bit periods of the input signal $S_{IN}$.

A low-complexity and low-cost circuit design shown in FIG. 5 may be employed to realize the sampling circuit 306 and the comparing circuit 308 of the signal quality detection circuit 300, where the sampled bits associated with the nominal sampling points $SP_N$ and $SP_{N\_}1$-$SP_{N\_}8$ may be obtained in more than one bit period of the input signal $S_{IN}$ (e.g., three bit periods of the input signal $S_{IN}$). However, this is for illustrative purposes only, and is not meant to be a limitation of the present invention. Alternatively, the sampled bits associated with the nominal sampling points $SP_N$ and $SP_{N\_}1$-$SP_{N\_}8$ may be obtained in a single bit period of the input signal $S_{IN}$.

Figure 9:
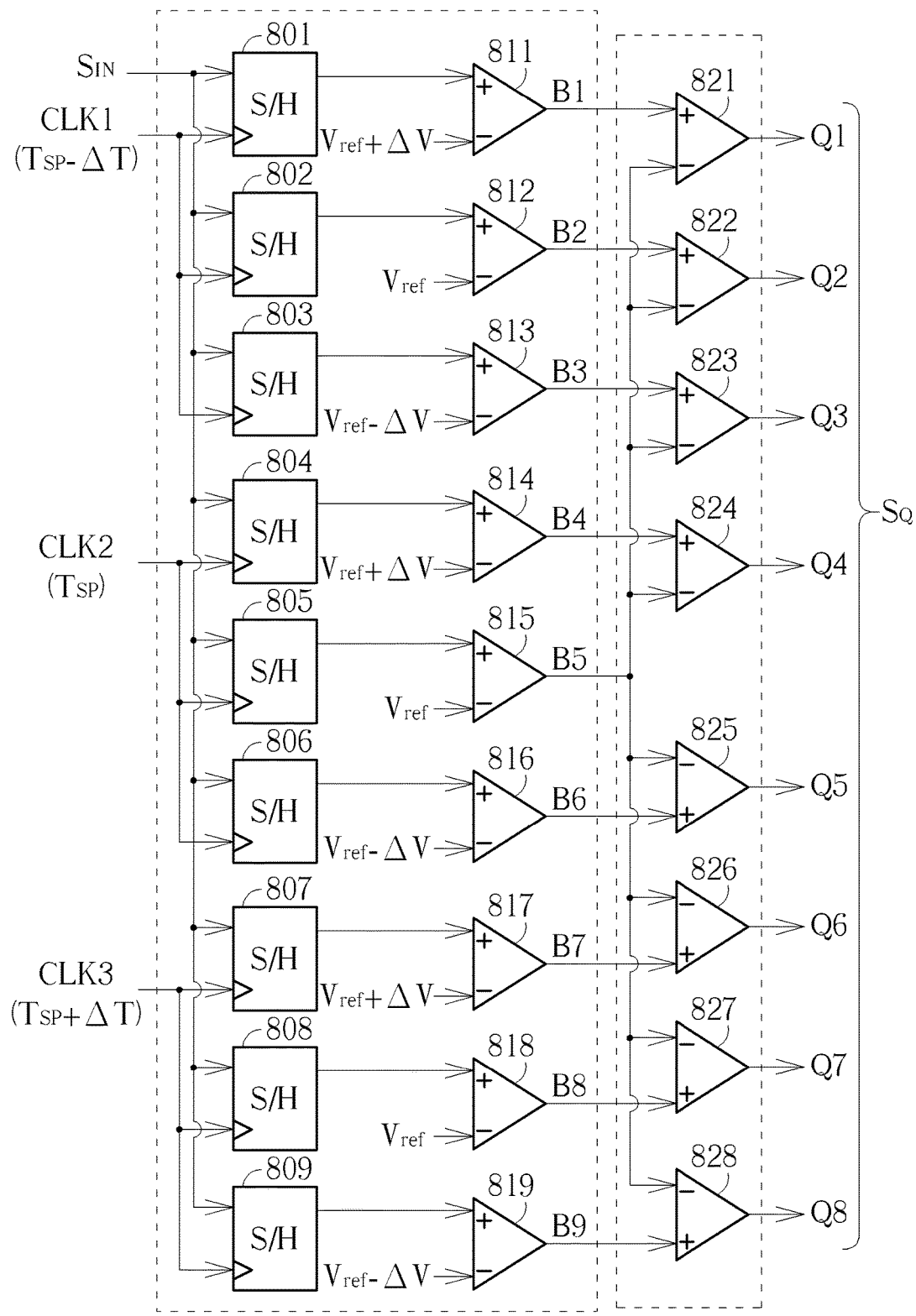
FIG. 9 is a diagram illustrating another circuit design of the sampling circuit and the comparing circuit shown in FIG. 3 according to an embodiment of the present invention.

FIG. 9 is a diagram illustrating another circuit design of the sampling circuit 306 and the comparing circuit 308 shown in FIG. 3 according to an embodiment of the present invention. In this embodiment, the sampling circuit 306 includes a plurality of sample and hold circuits (denoted by "S/H") 801-809 and a plurality of comparators 811-819; and the comparing circuit 308 includes a plurality of comparators 821-828. Each of the sample and hold circuits 801-809 is triggered by a clock received at a clock input port to sample a voltage input received at an input port, and then holds a sampled voltage at an output port. As shown in FIG. 9, the same input signal $S_{IN}$ is fed into input ports of all sample and hold circuits 801-809, the clock CLK1 is fed into clock input ports of three sample and hold circuits 801-803, the clock CLK2 is fed into the clock input ports of three sample and hold circuits 804-806, and the clock CLK3 is fed into the clock input ports of three sample and hold circuits 807-809. Further, the sample and hold circuits 801-809 generate sampled voltages to the following comparators 811-819, respectively. In this embodiment, the sampling reference voltage $V_{ref}-\Delta V$ is supplied to three comparators 813, 816, 819, the sampling reference voltage $V_{ref}$ is supplied to three comparators 812, 815, 818, and the sampling reference voltage $V_{ref}+\Delta V$ is supplied to three comparators 811, 814, 817. In this way, sampled bits corresponding to all of the nominal sampling points $SP_N$ and $SP_{N\_}1$-$SP_{N\_}8$ can be obtained during a single bit period of the input signal $S_{IN}$.

In this embodiment, the comparing circuit 308 generates a signal quality detection result $S_Q$ associated with the nominal sampling points $SP_N$ and $SP_{N\_}1$-$SP_{N\_}8$ by comparing the sampled bit B5 (which is obtained according to a central nominal sampling point $SP_N$ of the nominal sampling point pattern employed for signal quality detection) with each of the sampled bits B1-B4 and B6-B9 (which are obtained according to neighboring nominal sampling points $SP_{N\_}1$-$SP_{N\_}8$ included in the nominal sampling point pattern employed for signal quality detection). Hence, the comparison result Q1 is decided by the comparator 821 according to sampled bits B1 and B5, the comparison result Q2 is decided by the comparator 822 according to sampled bits B2 and B5, the comparison result Q3 is decided by the comparator 823 according to sampled bits B3 and B5, the comparison result Q4 is decided by the comparator 824 according to sampled bits B4 and B5, the comparison result Q5 is decided by the comparator 825 according to sampled bits B6 and B5, the comparison result Q6 is decided by the comparator 826 according to sampled bits B7 and B5, the comparison result Q7 is decided by the comparator 827 according to sampled bits B8 and B5, and the comparison result Q8 is decided by the comparator 828 according to sampled bits B9 and B5. As a person skilled in the art can readily understand details of the circuit design shown in FIG. 9 after reading above paragraphs directed to the circuit design shown in FIG. 5, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal quality detection circuit comprising:
a sampling circuit, configured to sample an input signal associated with a target device according to a plurality of nominal sampling points, and generate a plurality of sampled bits corresponding to the nominal sampling points, respectively, wherein the nominal sampling points are set by different combinations of sampling time and sampling reference voltage, and a number of the nominal sampling points is larger than four; and
a comparing circuit, configured to generate a plurality of comparison results each derived from comparing two of the sampled bits, and generate a signal quality detection result according to the comparison results;
wherein the signal quality detection circuit is included in a memory chip, and the comparing circuit is further configured to write the signal quality detection result into a mode register of the memory chip.

2. The signal quality detection circuit of claim 1, wherein the target device is the memory chip.

3. The signal quality detection circuit of claim 2, wherein the input signal is received by a data pin of the memory chip.

4. The signal quality detection circuit of claim 2, wherein the input signal is received by a command pin of the memory chip.

5. The signal quality detection circuit of claim 2, wherein the input signal is received by an address pin of the memory chip.

6. The signal quality detection circuit of claim 2, wherein the input signal is a loopback signal of an output signal generated to an output pin of the memory chip.

7. The signal quality detection circuit of claim 1, wherein the number of the nominal sampling points is not smaller than nine.

8. The signal quality detection circuit of claim 1, wherein the nominal sampling points comprises at least three nominal sampling points that are set by same sampling time but different sampling reference voltages.

9. The signal quality detection circuit of claim 1, wherein the nominal sampling points comprises at least three nominal sampling points that are set by a same sampling reference voltage but different sampling time.

10. A signal quality detection method comprising:
setting a plurality of nominal sampling points by different combinations of sampling time and sampling reference voltage, wherein a number of the nominal sampling points is larger than four;
sampling an input signal associated with a target device according to the nominal sampling points, and generating a plurality of sampled bits corresponding to the nominal sampling points, respectively;
generating a plurality of comparison results each derived from comparing two of the sampled bits, and generating a signal quality detection result according to the comparison results; and
writing the signal quality detection result into a mode register of a memory chip, wherein the signal quality detection method is performed by the memory chip.

11. The signal quality detection method of claim 10, wherein the target device is the memory chip.

12. The signal quality detection method of claim 11, wherein the input signal is received by a data pin of the memory chip.

13. The signal quality detection method of claim 11, wherein the input signal is received by a command pin of the memory chip.

14. The signal quality detection method of claim 11, wherein the input signal is received by an address pin of the memory chip.

15. The signal quality detection method of claim 11, wherein the input signal is a loopback signal of an output signal generated to an output pin of the memory chip.

16. The signal quality detection method of claim 10, wherein the number of the nominal sampling points is not smaller than nine.

17. The signal quality detection method of claim 10, wherein the nominal sampling points comprises at least three nominal sampling points that are set by same sampling time but different sampling reference voltages.

18. The signal quality detection method of claim 10, wherein the nominal sampling points comprises at least three nominal sampling points that are set by a same sampling reference voltage but different sampling time.

19. A signal quality detection circuit comprising:
a sampling circuit, configured to sample an input signal associated with a target device according to a plurality of nominal sampling points, and generate a plurality of sampled bits corresponding to the nominal sampling points, respectively, wherein the nominal sampling points are set by different combinations of sampling time and sampling reference voltage, and a number of the nominal sampling points is larger than four; and
a comparing circuit, configured to generate a plurality of comparison results each derived from comparing two of the sampled bits, and generate a signal quality detection result according to the comparison results;
wherein the input signal is used to transmit a bit sequence having each bit transmitted in one bit period; the sampled bits comprise at least a first sampled bit, a second sampled bit and a third sampled bit that are generated at different sampling time during a same bit period; and the comparison results comprise at least a first comparison result derived from comparing the first sampled bit and the second sampled bit and a second comparison result derived from comparing the third sampled bit and the second sampled bit.

* * * * *